(12) United States Patent
Cho et al.

(10) Patent No.: US 7,989,292 B2
(45) Date of Patent: Aug. 2, 2011

(54) METHOD OF FABRICATING A SEMICONDUCTOR DEVICE WITH A CHANNEL FORMED IN A VERTICAL DIRECTION

(75) Inventors: Sang-Hoon Cho, Icheon-si (KR);
Yun-Seok Cho, Icheon-si (KR);
Myung-Ok Kim, Icheon-si (KR);
Sang-Hoon Park, Icheon-si (KR);
Young-Kyun Jung, Icheon-si (KR)

(73) Assignee: Hynix Semiconductor Inc., Icheon-si, Gyeonggi-do (KR)

( * ) Notice: Subject to any disclaimer, the term of this patent is extended or adjusted under 35 U.S.C. 154(b) by 101 days.

(21) Appl. No.: 12/334,324

(22) Filed: Dec. 12, 2008

(65) Prior Publication Data
US 2009/0242971 A1 Oct. 1, 2009

(30) Foreign Application Priority Data
Apr. 1, 2008 (KR) .................. 10-2008-0030166

(51) Int. Cl.
*H01L 21/336* (2006.01)
(52) U.S. Cl. .................. 438/268; 257/E21.676
(58) Field of Classification Search .................. 438/268, 438/492, 700; 257/E21.676
See application file for complete search history.

(56) References Cited

U.S. PATENT DOCUMENTS
| 5,895,273 | A | * | 4/1999 | Burns et al. | 438/719 |
| 2007/0009140 | A1 | | 1/2007 | Jitsui et al. | |
| 2007/0082448 | A1 | * | 4/2007 | Kim et al. | 438/268 |

FOREIGN PATENT DOCUMENTS
KR 1020060041415 5/2006

OTHER PUBLICATIONS

Korean Notice of Allowance for Korean patent application No. 10-2008-0030166, citing the attached references.

* cited by examiner

*Primary Examiner* — W. David Coleman
(74) *Attorney, Agent, or Firm* — Lowe Hauptman Ham & Berner LLP

(57) ABSTRACT

In a method of fabricating a semiconductor device on a substrate which includes a plurality of pillar patterns, an impurity region between adjacent pillar patterns, a gate electrode on each pillar pattern, a first capping layer covering the gate electrode, and a separation layer covering the first capping layer between the gate electrodes of adjacent pillar patterns, the first capping layer is removed except for a portion contacting the separation layer, a sacrificial layer is formed to cover the gate electrode, a second capping layer is formed on sidewalls of each pillar pattern, the sacrificial layer is removed and a word line connecting the gate electrodes of the adjacent pillar patterns is formed. In the manufactured device, the first capping layer isolates the impurity region from the word line and the second capping region prevents the sidewalls of the respective pillar pattern from being exposed.

15 Claims, 6 Drawing Sheets

METHOD OF FABRICATING A SEMICONDUCTOR DEVICE WITH A CHANNEL FORMED IN A VERTICAL DIRECTION

CROSS-REFERENCE TO RELATED APPLICATIONS

The present application claims priority of Korean patent application number 10-2008-0030166, filed on Apr. 1, 2008, which is incorporated herein by reference in its entirety.

BACKGROUND

The disclosure relates to a fabrication technology of a semiconductor device, and more particularly, to a semiconductor device with a channel formed in a vertical direction and a method of fabricating the same.

It has been known to the inventors that a semiconductor device, in order to reduce its size, may have a channel formed in a vertical direction by arranging a source and a drain within an active region in the vertical direction.

FIGS. 1A to 1C are schematic views that illustrate a method, known to the inventors, of fabricating a semiconductor device with such a channel formed in the vertical direction.

Referring to FIG. 1A, a pillar head 13 is formed in a substrate 11 using a plurality of hard mask patterns 12, and a pillar neck 15 is formed in the substrate 11 using a sidewall protection layer 14 formed on sidewalls of the hard mask pattern 12 and the pillar head 13. Hereinafter, the pillar head 13 and the pillar neck 15 are referred to as a pillar pattern. An impurity region 16 is formed by doping the substrate 11 between adjacent pillar patterns with impurities, and a gate insulation layer 17 and a gate electrode 18 are formed to surround the pillar neck 15. A capping layer 19 is formed on the substrate 11.

Referring to FIG. 1B, the capping layer 19 over the substrate 11 is selectively removed to partially expose the substrate 11, and a trench is formed in the exposed substrate 11. A separation layer 20 filling the trench is formed to separate the impurity region 16. The separated impurity region 16A is referred to as a buried bit line. The capping layer 19 is etched by a wet etch process to expose the gate electrode 18.

Referring to FIG. 1C, a conductive layer 21 is deposited over the substrate 11, and an etch-back process is performed to form a damascene word line 21A contacting the gate electrode 18. Impurities are doped into the pillar head 13, and a capacitor contacting the pillar head 13 is formed, thereby obtaining a semiconductor device with a channel formed in a vertical direction.

In this known process, only the capping layer 19 formed on the sides of the gate electrode 18 should be selectively removed in the process of exposing the gate electrode 18. However, since the wet etch process is used as the removal process, the capping layer 19 formed on the sidewall protection layer 14 is also removed. Furthermore, the capping layer 19 formed on one or more sides of the separation layer 20 may also be accidentally removed.

Therefore, in forming the damascene word line 21A, the sidewall protection layer 14 is excessively lost, so that the pillar pattern may be exposed to the outside, as indicated by the reference symbol "F1". Further, if the capping layer 19 formed on the sides of the separation layer 20 is accidentally removed during the wet etch process, the buried bit line 16A and the damascene word line 21A may be shorted to each other, as indicated by the reference symbol "F2".

SUMMARY

In accordance with one or more embodiments, a method of fabricating a semiconductor device includes: providing a substrate; forming a plurality of pillar patterns on the substrate; forming an impurity region in the substrate between adjacent said pillar patterns; forming a gate electrode surrounding a portion of each said pillar pattern; forming a first capping layer over the substrate to cover the gate electrode of each said pillar pattern; separating the impurity region, and forming a separation layer covering the first capping layer between the gate electrodes of the adjacent pillar patterns; removing the first capping layer except for a portion contacting the separation layer, to partially expose the gate electrode of each said pillar pattern; forming a sacrificial layer covering the exposed gate electrodes; forming a second capping layer on sidewalls of the pillar pattern; removing the sacrificial layer; and forming a word line in the place where the sacrificial layer has been removed to connect the gate electrodes of the adjacent pillar patterns.

In accordance with one or more embodiments, a method of fabricating a semiconductor device uses a substrate that includes a plurality of pillar patterns, an impurity region between adjacent said pillar patterns, a gate electrode on each said pillar pattern, a first capping layer formed over the substrate to cover the gate electrode of each said pillar pattern, and a separation layer in the impurity region and covering the first capping layer between the gate electrodes of the adjacent pillar patterns. The method includes removing the first capping layer except for a portion contacting the separation layer, to partially expose the gate electrode of each said pillar pattern; forming a sacrificial layer covering the exposed gate electrodes; forming a second capping layer on sidewalls of the pillar pattern; removing the sacrificial layer; and forming a word line in the place where the sacrificial layer has been removed to connect the gate electrodes of the adjacent pillar patterns.

In accordance with one or more embodiments, a semiconductor device includes: a substrate having a plurality of pillar patterns and an impurity region between adjacent said pillar patterns, a gate electrode on a lower portion of a sidewall of each said pillar pattern, an insulating separation layer dividing the impurity region into two sub-regions each defining a buried bit line, a first capping layer between (i) the insulating separation layer and (ii) the gate electrode of one of the pillar patterns or a respective one of the sub-regions, a word line on top of the insulating separation layer and connecting the gate electrodes of the adjacent pillar patterns, and a second capping layer on an upper portion of the sidewall of each said pillar pattern, above said word line.

BRIEF DESCRIPTION OF THE DRAWINGS

Various embodiments are illustrated by way of example, and not by limitation, in the figures of the accompanying drawings, wherein elements having the same reference numeral designations represent like elements throughout.

DESCRIPTION OF EMBODIMENTS

In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer or substrate, it can be directly under the other layer or substrate, or one or more intervening layers may also be present. In addition, when a layer is referred to as being 'between' two layers, it can be the only layer between the two layers, or one or more intervening layers may also be present.

FIGS. 2A to 2G are schematic views illustrating a method of fabricating a semiconductor device with a channel formed in a vertical direction in accordance with some embodiments.

Figure 1A:
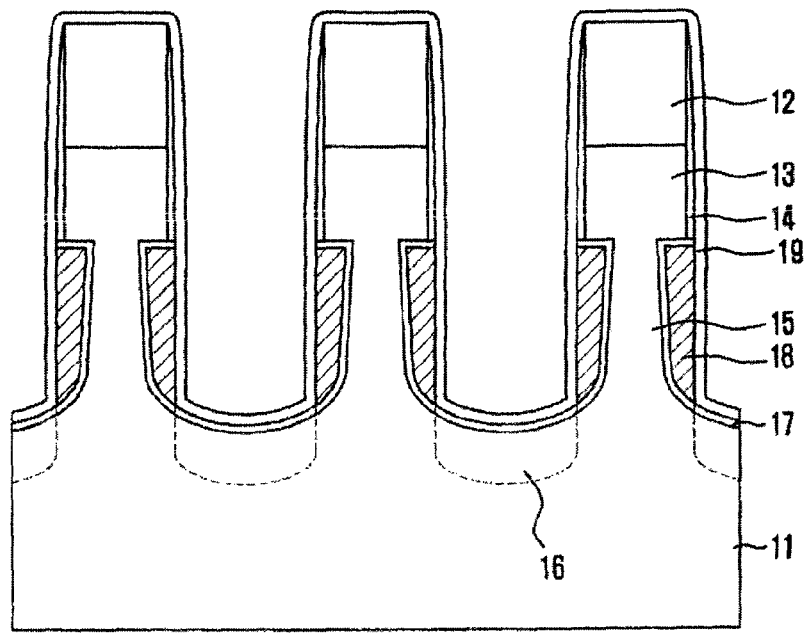
FIGS. 1A to 1C are schematic views illustrating a known method of fabricating a semiconductor device with a channel formed in a vertical direction.
Figure 1B:
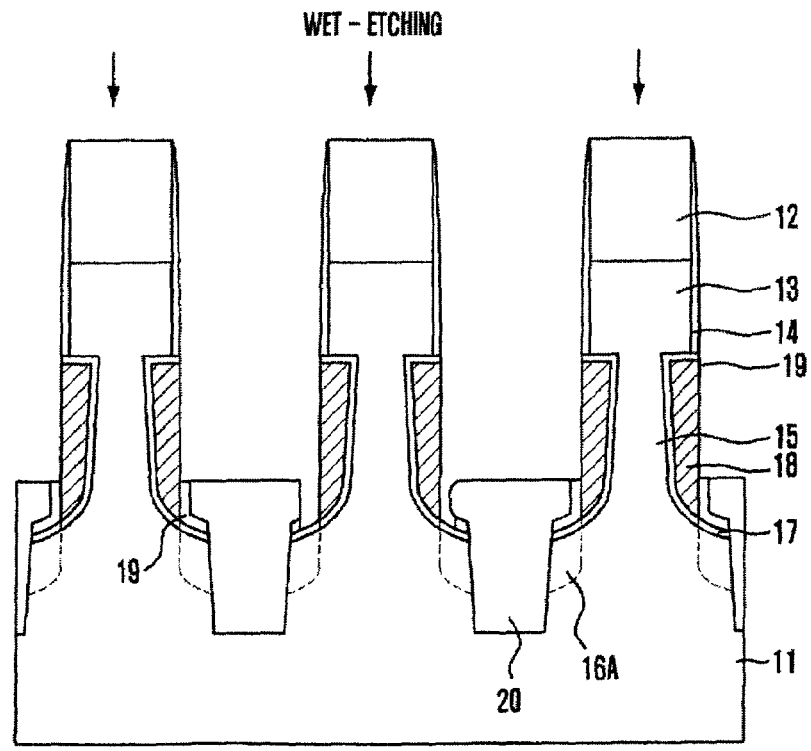
Figure 1C:
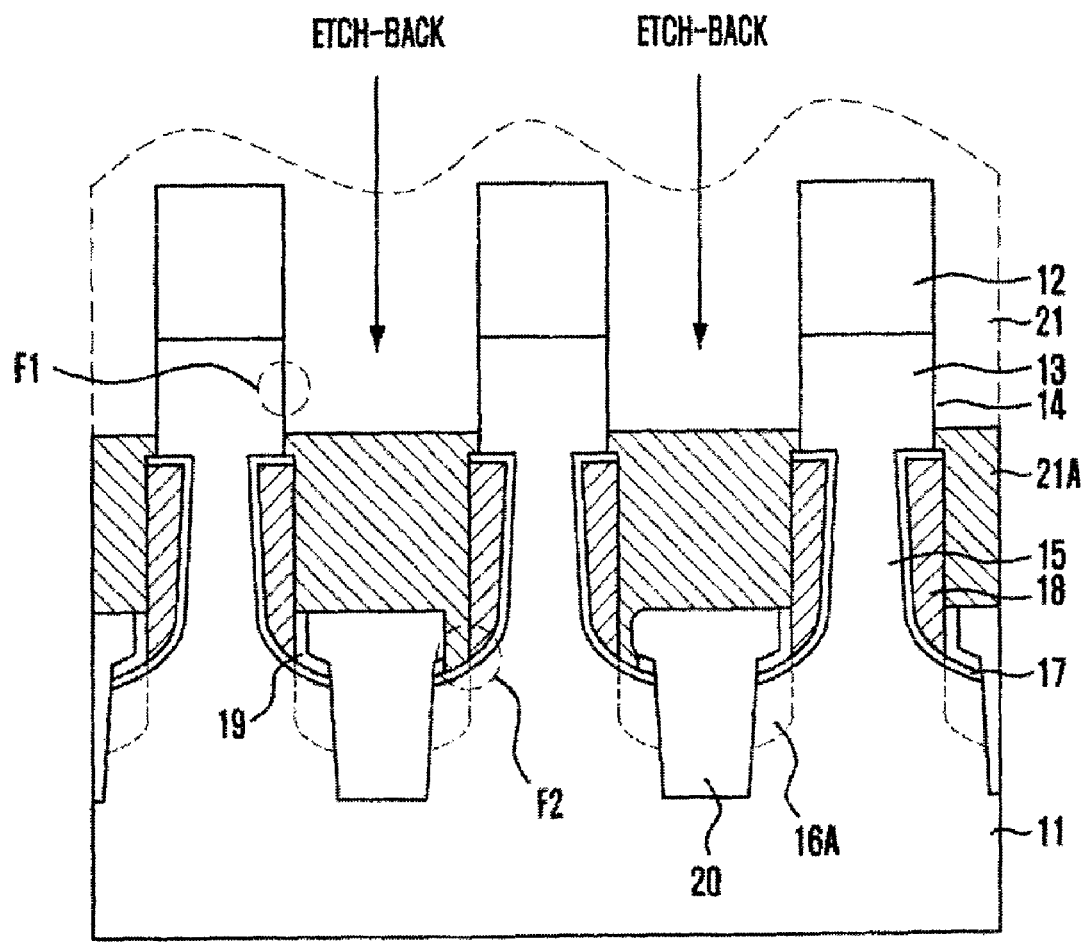
Figure 2A:
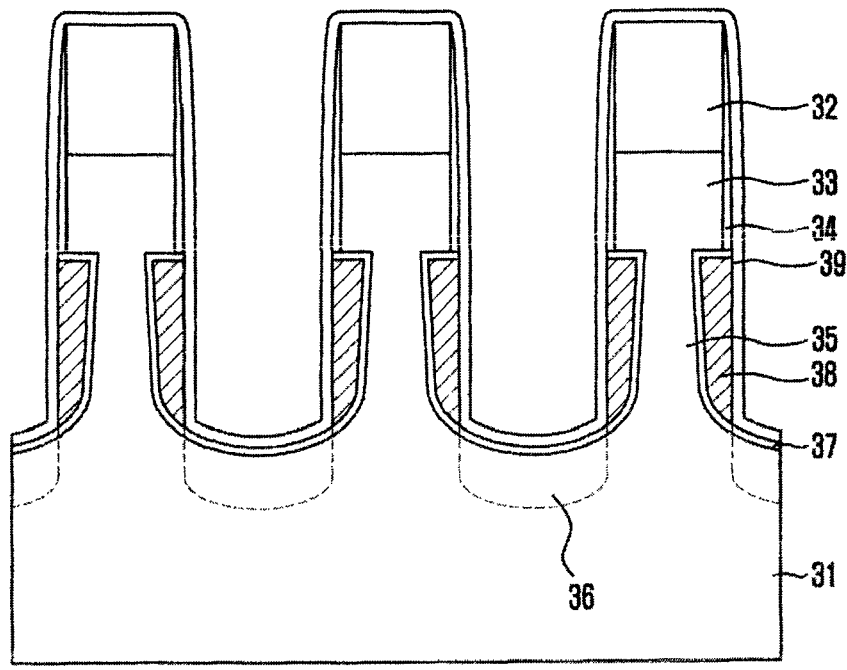
FIGS. 2A to 2G are schematic views illustrating a method of fabricating a semiconductor device with a channel formed in a vertical direction in accordance with some embodiments.

Referring to FIG. 2A, a plurality of hard mask layers 32 are formed over a substrate 31, and a pillar head 33 is formed by anisotropically etching the substrate 31 using the hard mask layers 32 as an etch barrier (or a mask). A sidewall protection layer 34 is formed on sidewalls of the pillar head 33 and the hard mask layer 32, and a pillar neck 35 is formed by isotropically etching the substrate 31 using the sidewall protection layer 34 as an etch barrier. Hereinafter, the pillar head 33 and the pillar neck 35 are commonly referred to as a pillar pattern.

An impurity region 36 is formed by doping impurities into the substrate 31 between adjacent pillar patterns.

A gate insulation layer 37 and a gate electrode 38 are formed on a sidewall of the pillar neck 35. The gate electrode 38 is formed by depositing a conductive layer and etching back the deposited conductive layer.

A first capping layer 39 is formed over the substrate 31 where the gate electrode 38 is formed. The first capping layer 39 serves as a passivation layer for protecting the pillar pattern and the gate electrode 38 in a subsequent process of separating the impurity region 36. To this end, the first capping layer 39 includes a nitride layer or an oxide layer. The nitride layer may include a silicon nitride ($Si_3N_4$) layer, and the oxide layer may include a thin film of one or more of silicon oxide ($SiO_2$), Plasma Enhanced Tetra Ethyl Ortho Silicate (PETEOS), Phosphorus Silicate Glass (PSG), Undoped Silicate Glass (USG), and High Density Plasma (HDP) oxide.

Figure 2B:
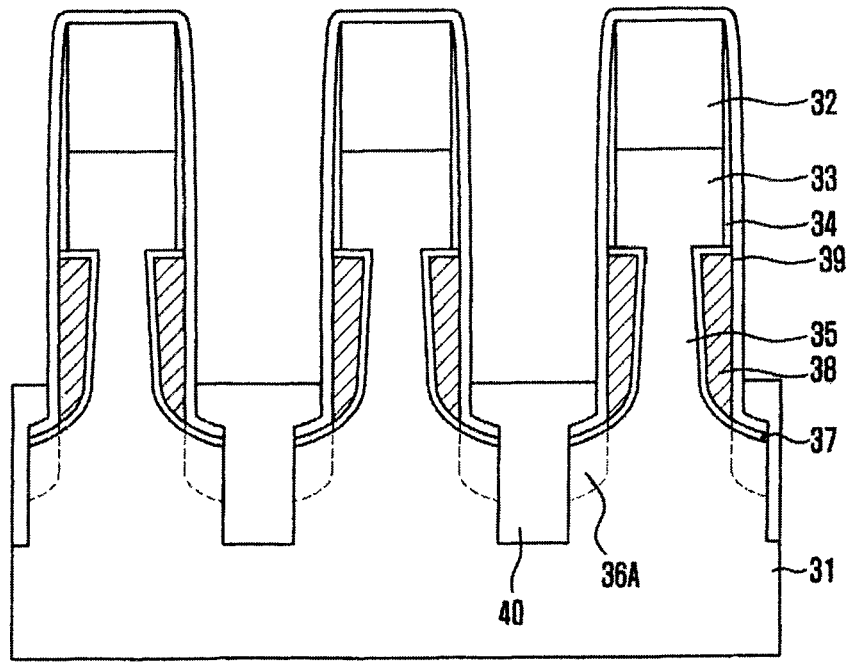

Referring to FIG. 2B, the impurity region 36 is separated to form a buried bit line 36A.

The process of separating the impurity region 36 includes a process of forming a trench dividing the impurity region 36 into two sub-regions and a process of filling the trench with a separation layer 40. The separation layer 40 is formed of an insulation material and covers a portion of the gate electrode 38 as well as the trench. Therefore, the separation layer 40 covers a portion of the first capping layer 39. During the process of separating the impurity region 36, the pillar pattern and the gate electrode 38 are protected by the first capping layer 39.

Figure 2C:
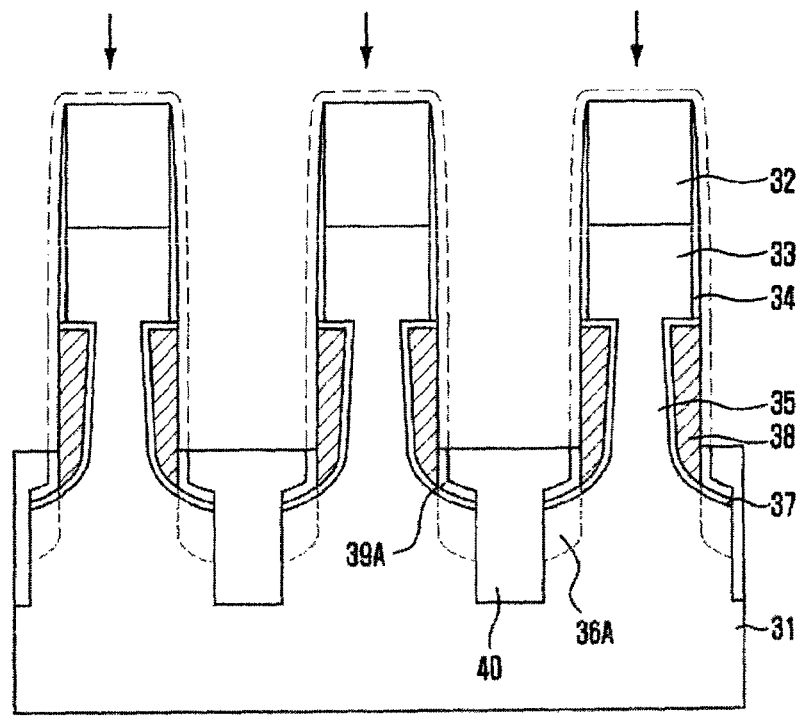

Referring to FIG. 2C, the first capping layer 39 is etched to expose the sidewall protection layer 34 and the gate electrode 38. In this case, to prevent the first capping layer 39A covered with the separation layer 40 from being accidentally removed, the first capping layer 39 is etched by a dry etch process or a dry cleaning process.

Figure 2D:
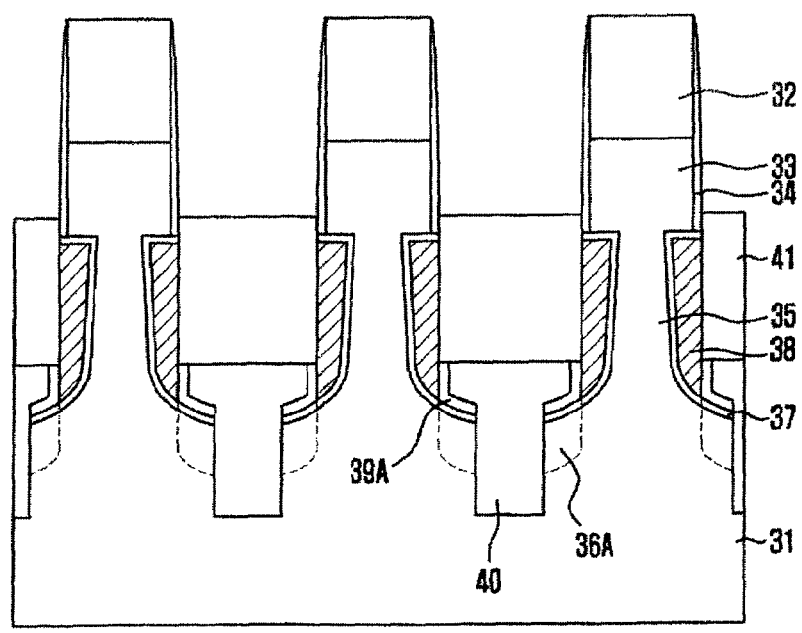

Referring to FIG. 2D, a sacrificial pattern 41 is formed to cover the gate electrode 38. Furthermore, the sacrificial pattern 41 may cover a portion of the sidewall of the sidewall protection layer 34 as well as the gate electrode 38.

The sacrificial pattern 41 in some embodiments includes a carbon-containing thin film. For example, the sacrificial pattern 41 may include a thin film formed of a photoresist, amorphous carbon, SiOC, SiC, or SOC.

In the case where the sacrificial pattern 41 is made of a photoresist, it is formed by a deposition process of the photoresist in a desired pattern. A shallow exposure process and a development process will be later sequentially performed to remove the sacrificial pattern 41 when it is no longer needed.

In the case where the sacrificial pattern 41 is made of amorphous carbon, a shallow strip process is performed, i.e., the sacrificial pattern 41 is formed by a deposition process and will be removed later, when it is no longer needed, using plasma, such as $O_2$ plasma. When the $O_2$ plasma is used, an etch selectivity to other thin films is significantly high, and thus, only the amorphous carbon layer will be selectively stripped. Furthermore, the use of SiOC, SiC and SOC can also obtain the same effect as amorphous carbon.

Figure 2E:
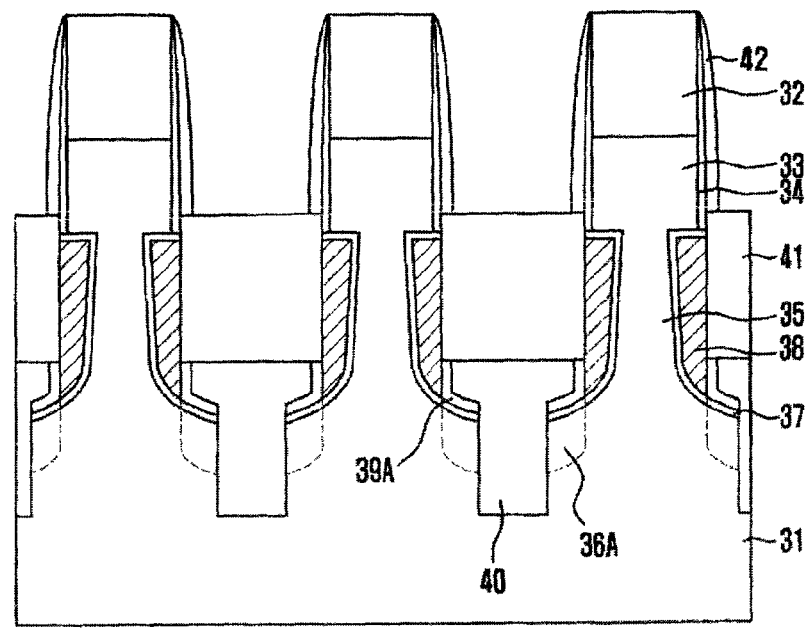

Referring to FIG. 2E, a second capping layer 42 is formed on the portions of the sidewall protection layer 34 that have not been covered by the sacrificial pattern 41.

A nitride layer or an oxide layer is deposited over the substrate 31 where the sacrificial pattern 41 is formed, and an anisotropic etch process is performed on the deposited layer to form the second capping layer 42. The nitride layer may include a silicon nitride ($Si_3N_4$) layer, and the oxide layer may include a thin film formed of silicon oxide ($SiO_2$), Plasma Enhanced Tetra Ethyl Ortho Silicate (PETEOS), Phosphorus Silicate Glass (PSG), Undoped Silicate Glass (USG), or High Density Plasma (HDP) oxide.

Figure 2F:
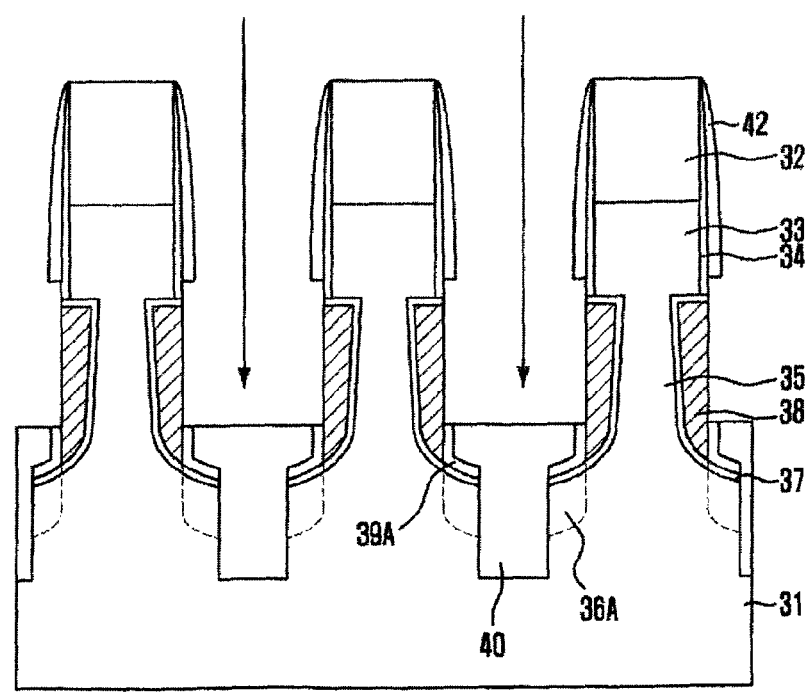

Referring to FIG. 2F, the sacrificial pattern 41 is removed using an appropriate process as detailed above. The process of removing the sacrificial pattern 41, in some embodiments, includes a process of stripping the sacrificial pattern 41 by using $O_2$ plasma.

Figure 2G:
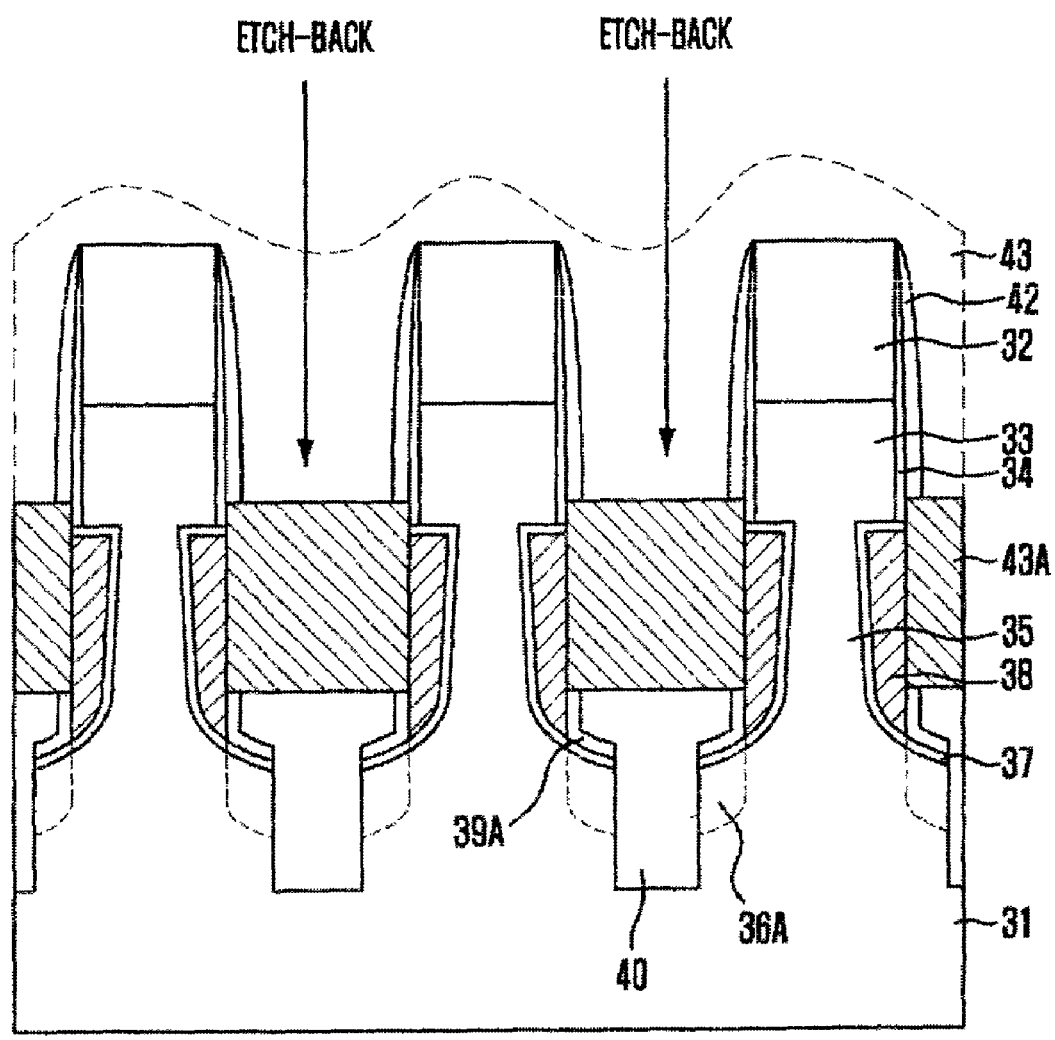

Referring to FIG. 2G, a damascene word line 43A is formed to connect facing gate electrodes 38 on adjacent pillar patterns.

The damascene word line 43A is formed by depositing a conductive layer 43 over the substrate 31 where the sacrificial pattern 41 has been removed, and performing an etch-back process on the deposited conductive layer. During the etch-back process, the second capping layer 42 protects the sidewall protection layer 34 and the pillar pattern, and prevents the pillar pattern from being exposed.

As described above, the first capping layer 39 protecting the pillar pattern in the process of forming the buried bit line 36A is etched, by a dry etch process or a dry cleaning process, before forming the damascene word line 43A. Therefore, it is possible to prevent undesirable loss of the first capping layer 39A formed on the sidewalls of the separation layer 40. Furthermore, it is possible to prevent undesirable short circuits between the damascene word line 43A and the buried bit line 36A.

Moreover, after forming the second capping layer 42 on the sidewalls of the sidewall protection layer 34 by using the sacrificial pattern 41, the process of removing the sacrificial pattern 41 and the process of forming the damascene word line 43A are sequentially performed. Since the second capping layer 42 exists on the sidewalls of the sidewall protection layer 34, the pillar pattern is stably protected in the processes of removing the sacrificial pattern 41 and forming the damascene word line 43A.

As described above, undesirable loss of the pillar pattern can be prevented by keeping and/or providing the first and second capping layers in the process of forming the damascene word line, and undesirable short circuits between the damascene word line and the buried bit line can also be prevented.

Furthermore, the reliability and stability of the semiconductor device can be ensured and the yield of the semiconductor device fabrication can also be increased.

While specific embodiments have been described, it will be apparent to those skilled in the art that various changes and modifications may be made.

What is claimed is:

1. A method of fabricating a semiconductor device, the method comprising:
   providing a substrate;
   forming a plurality of pillar patterns on the substrate;
   forming an impurity region in the substrate between adjacent the pillar patterns;
   forming a gate electrode surrounding a portion of each the pillar pattern;
   forming a first capping layer over an entire surface of the resultant structure including the gate electrode;
   forming a separation layer by separating the impurity region so that the separation layer contacts a portion of the first capping layer between the gate electrodes of the adjacent pillar patterns;
   removing the first capping layer except for the portion of the first capping layer contacting the separation layer, to partially expose the gate electrode of each the pillar pattern;
   forming a sacrificial layer covering the exposed gate electrodes by the portion of the first capping layer;
   forming a second capping layer over the resultant structure including the sacrificial layer to cover sidewalls of the pillar pattern;
   removing the entire sacrificial layer after the second capping layer is formed; and
   forming a word line in the place where the sacrificial layer has been removed to connect the gate electrodes of the adjacent pillar patterns.

2. The method of claim 1, wherein the first capping layer is removed by a dry etch process or a dry cleaning process.

3. The method of claim 1, wherein the sacrificial layer comprises a carbon-containing thin film.

4. The method of claim 1, wherein the sacrificial layer comprises a thin film formed of any one selected from the group consisting of a photoresist, amorphous carbon, SiOC, SiC, and SOC.

5. The method of claim 1, wherein the forming of the separation layer comprises:
   forming a trench dividing the impurity region into two sub-regions; and
   forming an insulation layer to fill the trench and cover partially the first capping layer.

6. The method of claim 1, wherein each of the first and second capping layers comprises a nitride layer or an oxide layer.

7. The method of claim 1, wherein
   the word line is formed by depositing a conductive layer and etching back the deposited conductive layer; and
   the second capping layer protects the sidewalls of the pillar pattern during said etching back.

8. A method of fabricating a semiconductor device using a substrate that comprises a plurality of pillar patterns, an impurity region between adjacent the pillar patterns, a gate electrode on each the pillar pattern, a first capping layer formed over an entire surface of the resultant structure including the gate electrode, and a separation layer, in the impurity region, contacting a portion of the first capping layer between the gate electrodes of the adjacent pillar patterns;
   the method comprising:
   removing the first capping layer except for the portion of the first capping layer contacting the separation layer, to partially expose the gate electrode of each the pillar pattern;
   forming a sacrificial layer covering the exposed gate electrodes by the portion of the first capping layer;
   forming a second capping layer over the resultant structure including the sacrificial layer to cover sidewalls of the pillar pattern;
   removing the entire sacrificial layer after the second capping layer is formed; and
   forming a word line in the place where the sacrificial layer has been removed to connect the gate electrodes of the adjacent pillar patterns.

9. The method of claim 8, wherein the first capping layer is removed by a dry etch process or a dry cleaning process.

10. The method of claim 8, wherein the sacrificial layer comprises a carbon-containing thin film.

11. The method of claim 8, wherein the sacrificial layer comprises a thin film formed of any one selected from the group consisting of a photoresist, amorphous carbon, SiOC, SiC, and SOC.

12. The method of claim 8, wherein each of the first and second capping layers comprises a nitride layer or an oxide layer.

13. The method of claim 8, wherein each of the first and second capping layers comprises at least one of silicon nitride ($Si_3N_4$), silicon oxide ($SiO_2$), Plasma Enhanced Tetra Ethyl Ortho Silicate (PETEOS), Phosphorus Silicate Glass (PSG), Undoped Silicate Glass (USG), and High Density Plasma (HDP) oxide.

14. The method of claim 8, wherein
   the word line is formed by depositing a conductive layer and etching back the deposited conductive layer; and
   the second capping layer protects the sidewalls of the pillar pattern during said etching back.

15. The method of claim 8, wherein the steps of the method are performed in the recited order.

* * * * *